(12) United States Patent
Guo et al.

(10) Patent No.: US 11,569,440 B2
(45) Date of Patent: Jan. 31, 2023

(54) MAKING A MEMORISTIC ARRAY WITH AN IMPLANTED HARD MASK

(71) Applicants: Yimin Guo, San Jose, CA (US); Rongfu Xiao, Dublin, CA (US); Jun Chen, Fremont, CA (US)

(72) Inventors: Yimin Guo, San Jose, CA (US); Rongfu Xiao, Dublin, CA (US); Jun Chen, Fremont, CA (US)

(*) Notice: Subject to any disclaimer, the term of this patent is extended or adjusted under 35 U.S.C. 154(b) by 2 days.

(21) Appl. No.: 15/412,076

(22) Filed: Jan. 23, 2017

(65) Prior Publication Data

US 2022/0059758 A1 Feb. 24, 2022

Related U.S. Application Data

(63) Continuation-in-part of application No. 15/407,274, filed on Jan. 17, 2017, now abandoned.

(51) Int. Cl.
| | | |
|---|---|---|
| H01L 43/12 | (2006.01) | |
| H01L 27/24 | (2006.01) | |
| H01L 45/00 | (2006.01) | |
| H01L 27/22 | (2006.01) | |

(52) U.S. Cl.
CPC .......... *H01L 43/12* (2013.01); *H01L 27/2463* (2013.01); *H01L 45/1675* (2013.01); *H01L 45/1683* (2013.01); *H01L 45/1691* (2013.01); *H01L 27/222* (2013.01)

(58) Field of Classification Search
CPC ......... H01L 27/11556; H01L 21/76224; H01L 21/76227; H01L 21/76229; H01L 21/822; H01L 21/823481; H01L 27/11582; H01L 27/11548; H01L 27/11575; H01L 27/11521; H01L 21/76802; H01L 21/76897; H01L 27/11568; H01L 27/11551; H01L 21/31051; H01L 21/76205; H01L 21/76837; H01L 27/11524; H01L 29/4236; H01L 45/1666; H01L 45/1675; H01L 45/1691; H01L 45/1683
See application file for complete search history.

(56) References Cited

U.S. PATENT DOCUMENTS

| | | | | |
|---|---|---|---|---|
| 2003/0199104 A1* | 10/2003 | Leuschner | ............... | G11C 11/16 257/E27.005 |
| 2012/0028373 A1* | 2/2012 | Belen | ...................... | H01L 43/12 428/411.1 |
| 2012/0146166 A1* | 6/2012 | Levi | ........................ | H01L 43/08 257/E29.323 |

* cited by examiner

*Primary Examiner* — Davienne N Monbleau
*Assistant Examiner* — Nader M Elmarhoumi

(57) ABSTRACT

The invention disclosed a method to make an implanted hard mask with ultra-small dimensions for fabricating integrated nonvolatile random access memory. Instead of directly depositing hard mask material on top of the memory film stack element, we first make ultra-small VIA holes on a pattern transfer molding (PTM) layer using a reverse memory mask, then fill in the hard mask material into the VIA holes within the PTM material. Ultra-small hard mask pillars are formed after removing the PTM material. To improve the adhesion of the hard mask pillars with the underneath memory stack element, a hard mask sustaining element (HMSE) is added below PTM. Due to a better materials adhesion between HMSE and the hard mask, a stronger hard mask array can be formed.

19 Claims, 16 Drawing Sheets

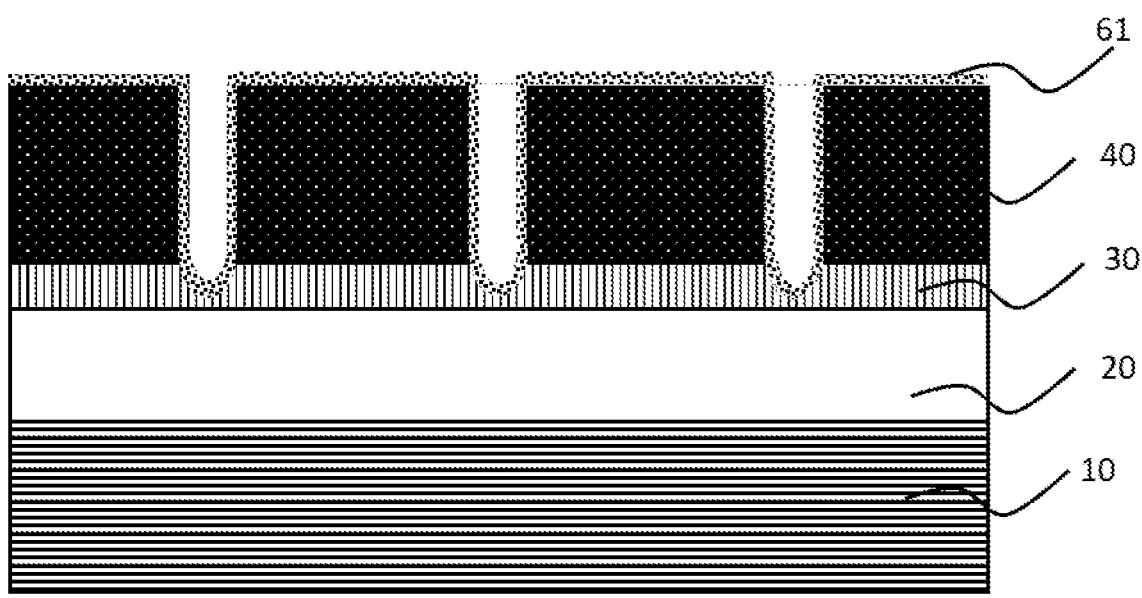
Fig. 3D1

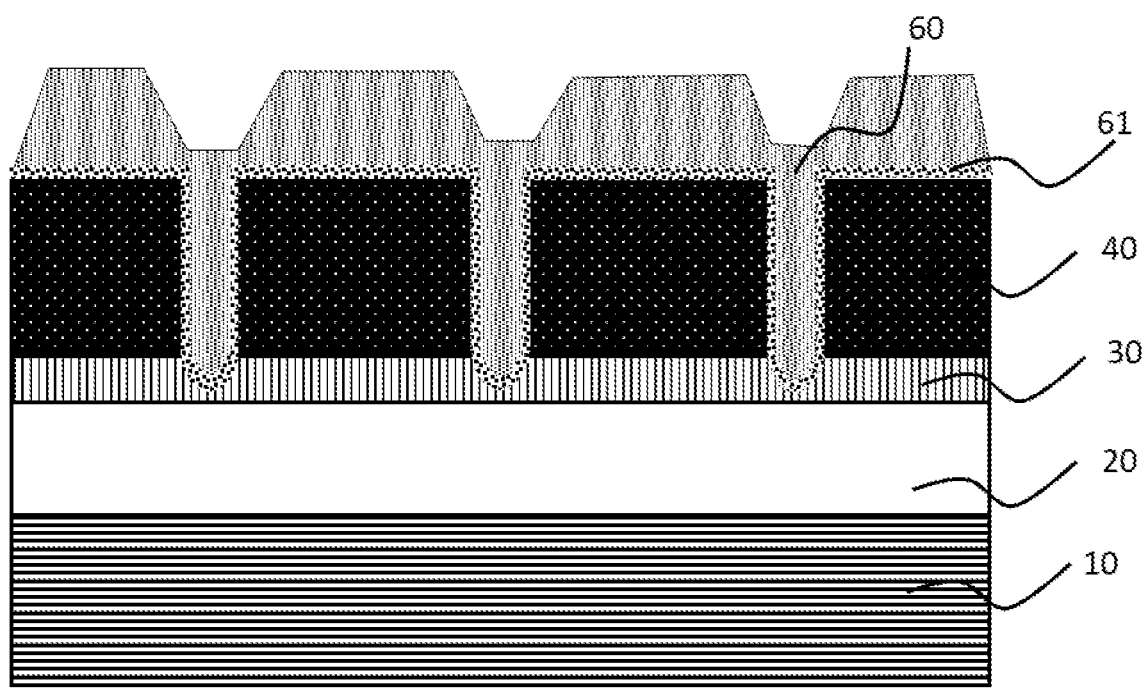
Fig. 3D2

MAKING A MEMORISTIC ARRAY WITH AN IMPLANTED HARD MASK

RELATED APPLICATIONS

This application is a continued application of prior application Ser. No. 15/407,274 filed on 2017 Jan. 17. This application seeks priority date as that of U.S. Utility patent application Ser. No. 15/407,274 filed on 2017 Jan. 17. The entire contents of each of which are incorporated herein by reference.

BACKGROUND OF THE INVENTION

1. Field of the Invention

This invention relates generally to a method to make a memoristic array with ultra small dimension using an implanted hard mask in a bedding layer.

2. Description of the Related Art

In recent years, nonvolatile random access memory has become a hot topic in semiconductor industry. The nonvolatile random access memory includes resistance random access memory (RRAM), phase change random access memory (PCRAM), ferroelectric random access memory (FRAM), and particular magnetic random access memories (MRAMs) using the magnetoresistive effect of ferromagnetic tunnel junctions (also called MTJs) have been drawing increasing attention as the next-generation solid-state nonvolatile memories that can cope with high-speed reading and writing, large capacities, and low-power-consumption operations. A ferromagnetic tunnel junction has a three-layer stack structure formed by stacking a recording layer having a changeable magnetization direction, an insulating spacing layer, and a fixed layer that is located on the opposite side from the recording layer and maintains a predetermined magnetization direction To record information in such magnetoresistive elements, there has been suggested a write method using spin momentum transfers or spin torque transfer (STT) switching technique, or the so-called STT-MRAM. Depending on the direction of magnetic polarization, STT-MRAM is further clarified as in-plane iSTT-MRAM and perpendicular pSTT-MRAM (with magnetization perpendicular to the wafer surface), among which pSTT-MRAM is preferred. According to this method, the magnetization direction of a recording layer is reversed by applying a spin-polarized current to a magnetoresistive element. Furthermore, as the volume of the magnetic layer forming the recording layer is reduced, the injected spin-polarized current to write or switch can be also smaller. Accordingly, this method is expected to be a write method that can achieve both device miniaturization and currents reduction.

In the mean time, since the switching current requirements reduce with decreasing MTJ element dimensions, pSTT-MRAM has the potential to scale nicely at the most advanced technology nodes. Thus, it is desirable to pattern pSTT-MRAM elements into ultra-small dimensions having a good uniformity and minimum impact on MTJ magnetic properties by a manufacturing method that realizes high yield, highly-accurate reading, highly-reliable recording and low power consumption while suppressing destruction and reduction of life of MTJ memory device during recording based on resistance changes, and maintaining a high thermal factor for a good data retention.

However, patterning a small dimension MTJ element may lead to increasing variability in MTJ resistance and sustaining relatively high switching current or recording voltage variation in a pSTT-MRAM; accordingly a degradation of MRAM performance would occur. In the current MRAM fabrication process, a heavy metal such as Ta is deposited on top of a MTJ stack as hard mask material and a photoresist stack is spin-coated on top of Ta and subsequently patterned. The patterned wafer is then etched to form Ta hard mask pillars using the patterned photoresist as a mask. Fabrication of MTJ cell with pillar dimensions of 65 nm or less requires 193 nm or finer lithography with a photoresist layer thickness less than 250 nm. However, a thin photoresist layer requires a thin Ta hard mask layer to guarantee that the hard mask pattern will be completely formed before the photoresist mask is consumed during an etch transfer step. Thus, on one hand, the thickness of a Ta layer should be sufficient to allow a complete etching of MRAM film stack. On the other hand, the Ta layer should not be too thick since a thicker photoresist mask will be required for pattern transfer, and as the photoresist thickness increases there is a greater tendency for the photoresist pattern to collapse which drives more rework and higher cost. Thus, other alternatives to form a small Ta hard mask with sufficient thickness are necessary when fabricating MTJ cell beyond 40 nm.

BRIEF SUMMARY OF THE PRESENT INVENTION

The present invention discloses a novel method to make hard mask with ultra-small dimension for fabricating integrated nonvolatile random access memory, for example, magnetic-random-access memory (MRAM). Instead of directly depositing hard mask material on top of the MRAM film element, we first make ultra-small VIA holes on a pattern transfer molding (PTM) layer using a reverse MRAM mask, then fill in the hard mask material into the VIA holes within the PTM material. Ultra small hard mask pillars are formed after removing the molding material. To improve the adhesion of the hard mask pillars, a bedding layer is added below PTM. Using PTM as the mask, array of ditches are first formed in the bedding layer to implant a hard mask seed in the ditch before filling the main portion of the hard mask in the PTM VIA. For a better formation of the ditches, an etching stop layer can be added below the bedding layer to allow some over-etch of the bedding layer without punching into the memory layer. Due to better materials adhesion between bedding layer and the hard mask, a robust hard mask array can be formed.

BRIEF DESCRIPTION OF THE DRAWINGS

FIG. 3D1 is a schematic cross-sectional view showing a memory device at an immediate manufacture stage after coating process of a first hard mask material, as a first part of an alternative step of the step shown in FIG. 3D.

FIG. 3D2 is a schematic cross-sectional view showing a memory device at an immediate manufacture stage after filling process of a second hard mask material, as a second part of an alternative step of the step shown in FIG. 3D.

DETAILED DESCRIPTION OF THE INVENTION

Figure 1:
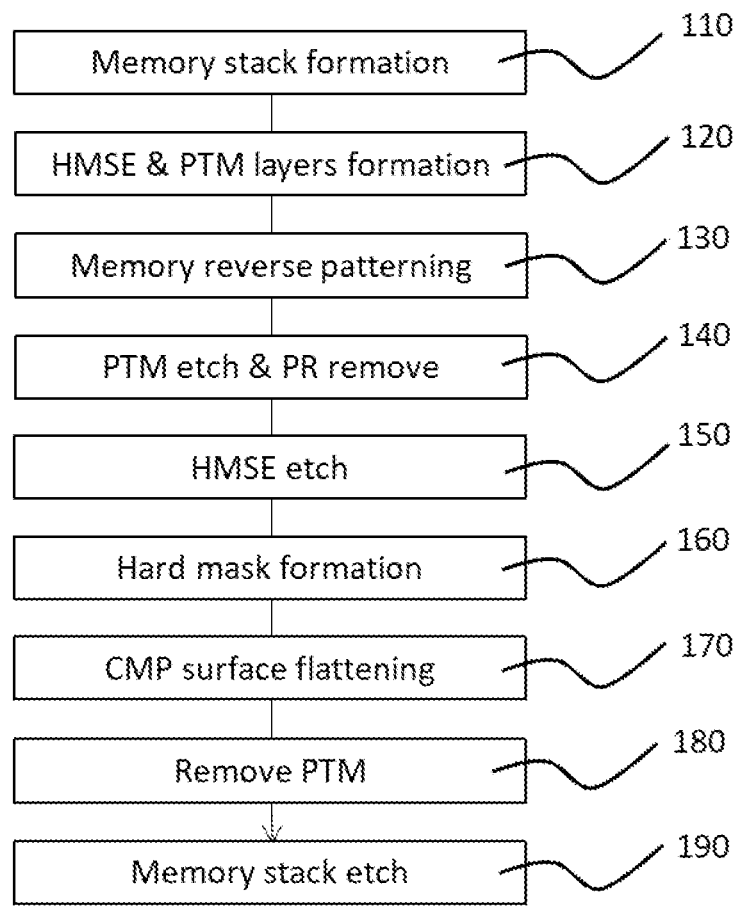
FIG. 1 is a process flow chart of forming an implanted hard mask on a memory film stack.

FIG. 1 shows a process flow chart of a memory array fabrication in this invention, which comprises: forming a memory film stack element (MFSE), forming a bedding layer or a hard-mask sustaining element (HMSE) and forming a pattern transfer molding (PTM) layer, reverse photolithography, etching process of the PTM layer and photo-resist removal, etching process of the HMSE, filling of hard-mask (HM) material into VIA holes, CMP flattening of the top PTM surface, removing of the remaining PTM material, and etching of the memory film stack.

Figure 2A:
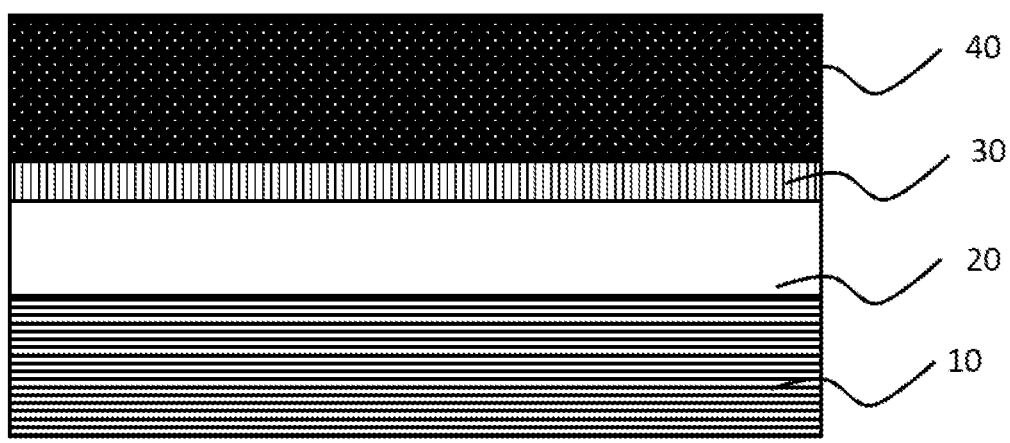
FIG. 2A is a schematic cross-sectional view showing a memory device at an immediate manufacture stage after forming of a hard-mask sustaining element and a pattern-transfer molding layer on a memory film stack.

FIG. 2A is a schematic cross-sectional view showing a memory device after forming of a bottom electrode (BE) 10, an MFSE 20, a HMSE 30 and a PTM layer 40. Although the material choice for the MFSE is different for MRAM, RRAM, PCRAM or FRAM, the rest materials and processes may be the same. Here we take MRAM as an example for process illustration for this invention. In MRAM, the key element is the magnetic tunneling junction (MTJ) tri-layer. For bottom pinned pSTT-MRAM, the location of the MTJ tri-layers are, respectively counting from bottom to top, magnetic fixed layer with a fixed magnetization, oxide tunneling barrier, and recording layer with changeable magnetization; and for top-pinned pSTT-MRAM, the location of the fixed layer and recording layer is exchanged. Instead of directly depositing the HM layer on the MTJ stack, we first form a hard mask PTM layer. The choice of PTM materials is either carbon, or carbon-containing material or other inorganic dielectrics, such as SiO2, SiN, SiON that can be easily removed after hard mask formation. The thickness of the PTM ranges from around 50 nm to around 200 nm.

Figure 2B:
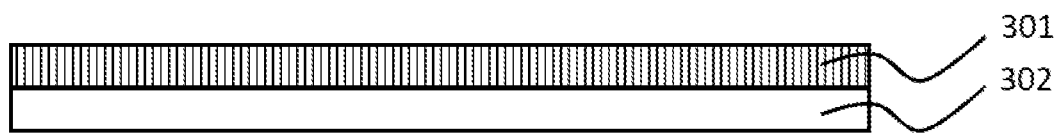
FIG. 2B is a schematic cross-sectional view showing a hard-mask sustaining element consisting of an etching-stop sub-layer and a hard-mask sustaining material sub-layer.
Figure 2C:
FIG. 2C is a schematic cross-sectional view showing a memory film stack element consisting of a lower electrical contact, a memory stack and a capping layer.
Figure 2D:
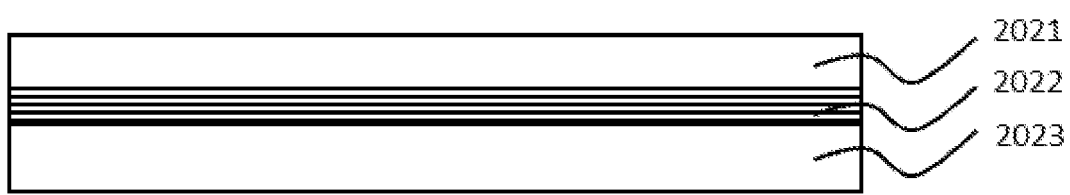
FIG. 2D is a schematic cross-sectional view showing a memory stack consisting of a tunneling barrier layer sandwiched by a magnetic reference layer and a magnetic memory layer.

The HMSE underneath the PTM layer serves to better sustain or hold a hard mask (HM) pillow when the PTM layer is removed in the late process. The HMSE can be a single layer of metal. The HMSE can also be made of a bi-layer stack consisting of a HMSE material sub-layer 301 and an etch-stop (ES) sub-layer 302, as shown in FIG. 2B. Here, the ES sub-layer 302 allows certain over-etch of the HMSE material sub-layer 301 without punching into the film memory stack. In another word, it provides a protection for the memory film stack and an improved process window. The criteria for material selection of the HMSE or the HMSE material sub-layer is that its sticking or gluing strength with the hard mask material is sufficiently high so that the hard mask pillar would not fall after removal of the PTM layer in a late process. For example, the HMSE comprises one or more elements selected from the group of W, Ti, Ta, Zr, Hf, Nb and Mo, and has a thickness ranging from around 2 nm to around 20 nm. As for the ES sub-layer, a material like Ru, Ni, Rh, Pd, Cu, Ag, Au, Pt, Fe, Co, NiCr, NiFeCr, and their alloys would be a good choice. The ES sub-layer may has a thickness ranging around 2 nm to around 10 nm, which could provide an enough process margin for over-etch of PTM without damaging its underneath memory film stack. The MFSE 20 can be made of three sequential steps comprising of: forming a lower electrical contact (LEC) 201; forming a memory stack (MS) 202 atop the LEC 201; and forming a capping layer 203 atop the MS 202, as shown in FIG. 2C. Forming the memory stack (MS) 202 comprises forming of an MTJ tri-layer stack consisting of a magnetic reference layer, a magnetic memory layer and a tunneling layer which is sandwiched by the magnetic reference layer and the magnetic memory layer. As shown in FIG. 2D, the magnetic reference layer, the tunneling layer and the magnetic memory layer can be the layer 2021, the layer 2022 and the layer 2023 respectively, or the magnetic reference layer, the tunneling layer and the magnetic memory layer can be the layer 2023, the layer 2022 and the layer 2021 respectively.

Figure 2E:
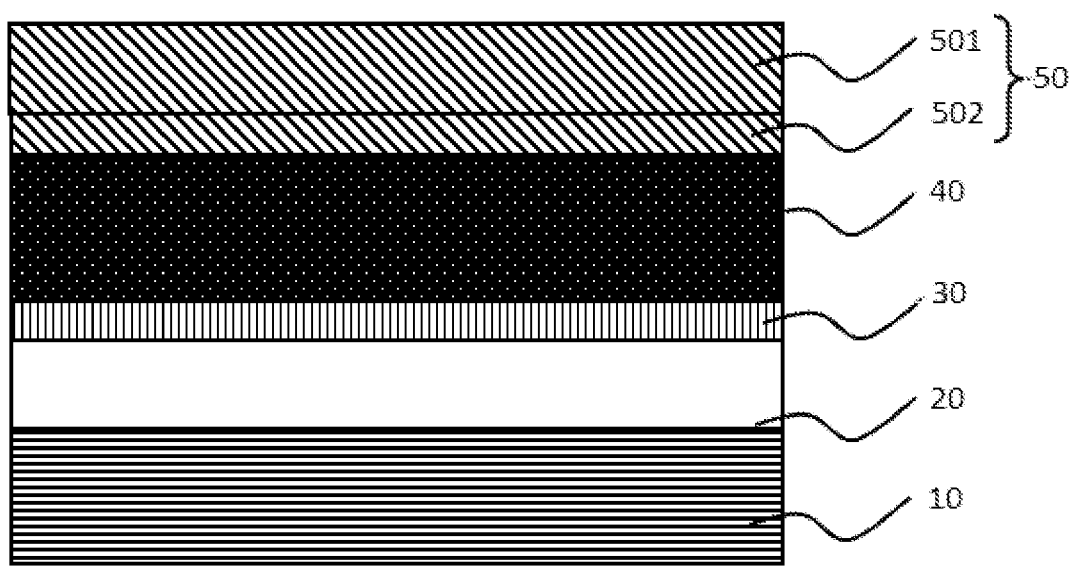
FIG. 2E is a schematic cross-sectional view showing a memory device at an immediate manufacture stage after forming of a photo-resist element (PRE) comprising a bi-layer stack on a pattern-transfer molding layer.
Figure 2F:
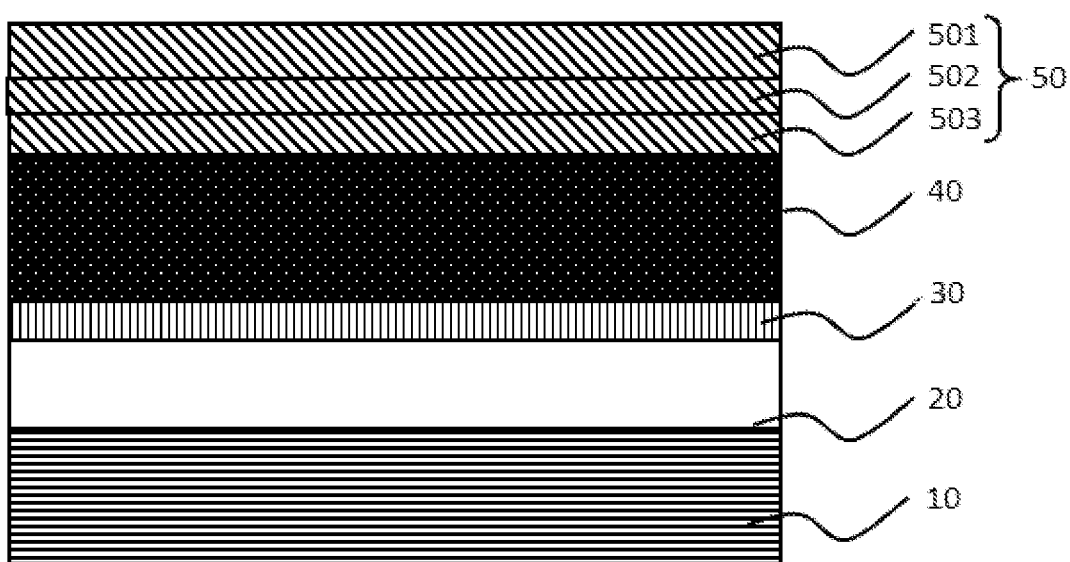
FIG. 2F is a schematic cross-sectional view showing a a memory device at an immediate manufacture stage after forming of a photo-resist element (PRE) comprising a tri-layer stack on a pattern-transfer molding layer.
Figure 3A:
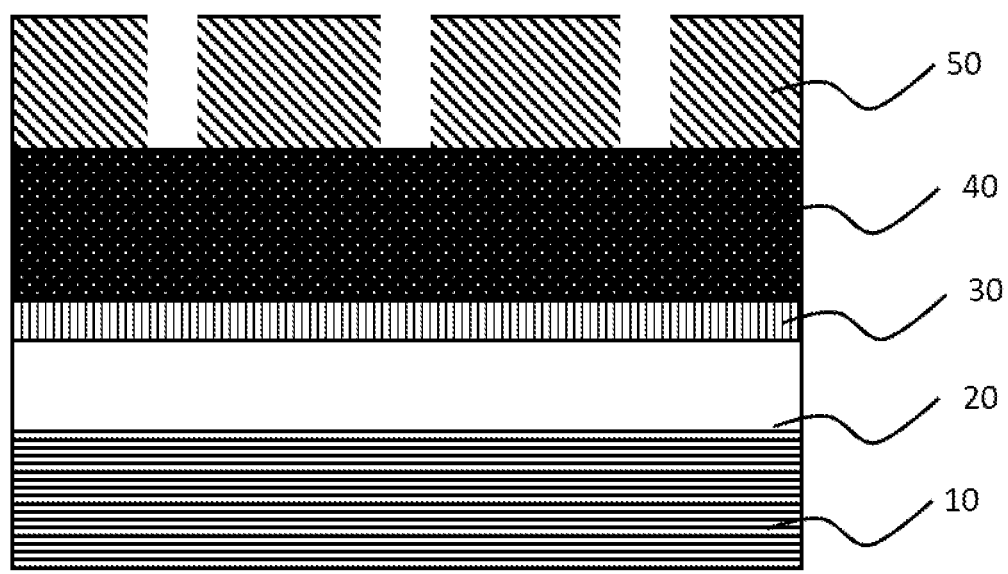
FIG. 3A is a schematic cross-sectional view showing a memory device at an immediate manufacture stage after a reverse photolithography.

After the material depositions as described above, a photo-resist element (PRE) is spin-coated on the PTM layer. The PRE (50) can be either a bi-layer stack such as BARC (502)/PR (501) or SiARC (502)/PR (501), as shown in FIG. 2E, or a tri-layer such as OPL (503)/BARC (502)/PR (501) or OPL (503)/SiARC (502)/PR (501), as shown in FIG. 2F, wherein PR refers to a photo-resist, BARC refers to a bottom-antireflection coating layer, SiARC refers to a Si-based antireflection coating layer, and OPL refers to an organic planarization layer. FIG. 3A is a schematic cross-sectional view showing a memory device at an immediate manufacture stage after a reverse photolithography which forms a patterned photo-resist element (PRE) 50.

Figure 3B:
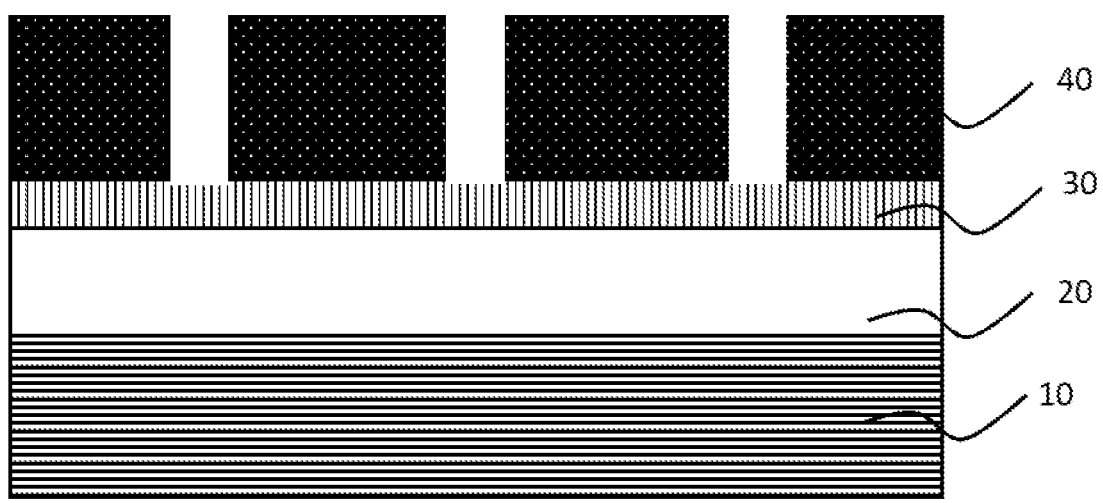
FIG. 3B is a schematic cross-sectional view showing a memory device at an immediate manufacture stage after etching process of the pattern-transfer molding layer and photo-resist removal.

Then the exposed PTM material from the open VIA holes is etched by reactive ion etching (RIB) using a mixture of CF4, and C, F, H containing gas gases; or by oxygen (O2, O3) ashing for C containing PTM. After the RIE etching, the PRE is removed by an oxygen ashing process, forming a well-formed hard mask template or mold with a reverse polarity. FIG. 3B is a schematic cross-sectional view showing a memory device at an immediate manufacture stage after etching process of the pattern-transfer molding layer 40 and photo-resist removal.

Figure 3C:
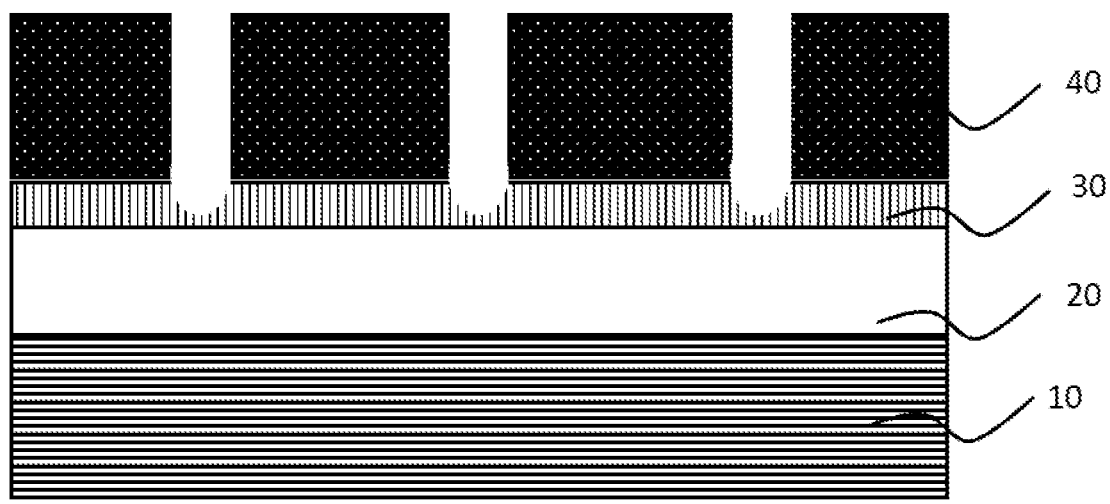
FIG. 3C is a schematic cross-sectional view showing a memory device at an immediate manufacture stage after etching process of hard-mask sustaining element.

The HMSE material sub-layer 301 can be etched using SF6, SF6+Ar, or Cl2 containing gases or ion beam milled using Ar+, Ne+ or Kr+ gas, while the etch-stop sub-layer 302 provides a protection for the MTJ stack. FIG. 3C is a schematic cross-sectional view showing a memory device at an immediate manufacture stage after etching process of the HMSE 30. The remaining HMSE material in each cavity has a concave top surface.

Figure 3D:
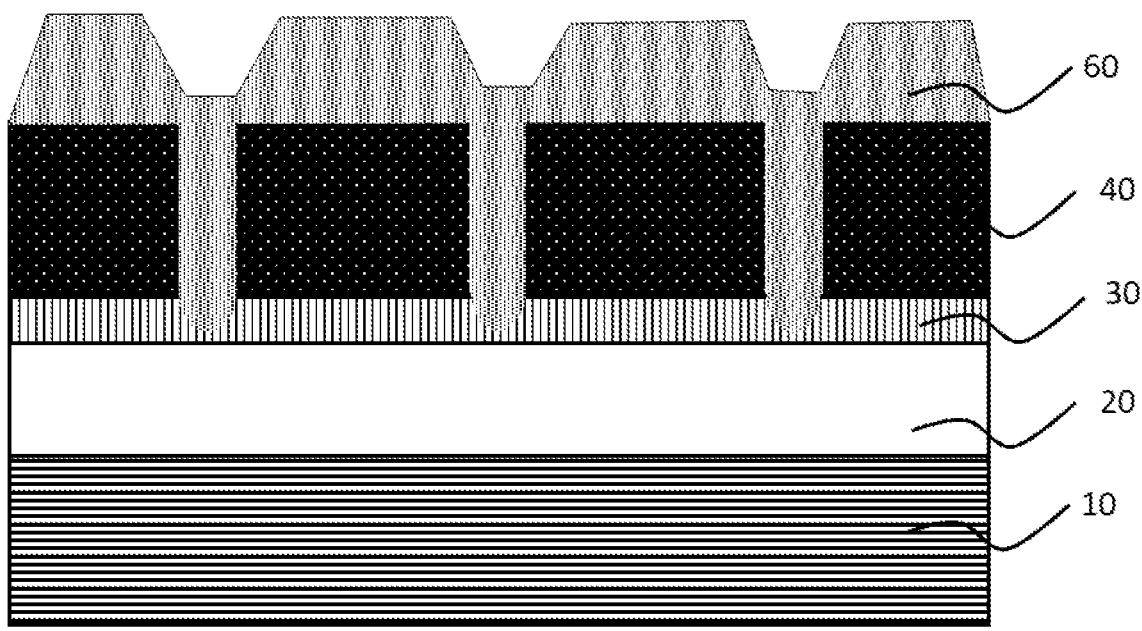
FIG. 3D is a schematic cross-sectional view showing a memory device at an immediate manufacture stage after filling process of hard mask material.

FIG. 3D is a schematic cross-sectional view showing a memory device at an immediate manufacture stage after filling process of hard mask material 60. A typical hard mask material suitable for the MTJ etch is Ta or W due to their higher etching selectivity values with respect to the MTJ film stack. Especially, Ta has a much higher etching selectivity than the MTJ film stack. A preferred hard mask filling method is either by electroplating using W- or Ta-containing solution or atomic layer deposition (ALD) using some volatile W- or Ta-containing metalorganic precursors. In order to improve wetting, it is preferred to have a first hard mask material and a second hard mask material, in which the first hard mask material is first coated on the VIA walls and the HMSE ditches as a seed layer, followed by the second hard mask material refilling. A selection of the first hard mask material is one or more of W, Ti, Ta, WN, TiN, and TaN, and a selection of the second hard mask material is Ta or W. FIG. 3D1 is a schematic cross-sectional view showing a memory device at an immediate manufacture stage after filling process of the first hard mask material 61, and FIG. 3D2 is a schematic cross-sectional view showing a memory device at an immediate manufacture stage after filling process of the second hard mask material 62.

Figure 3E:
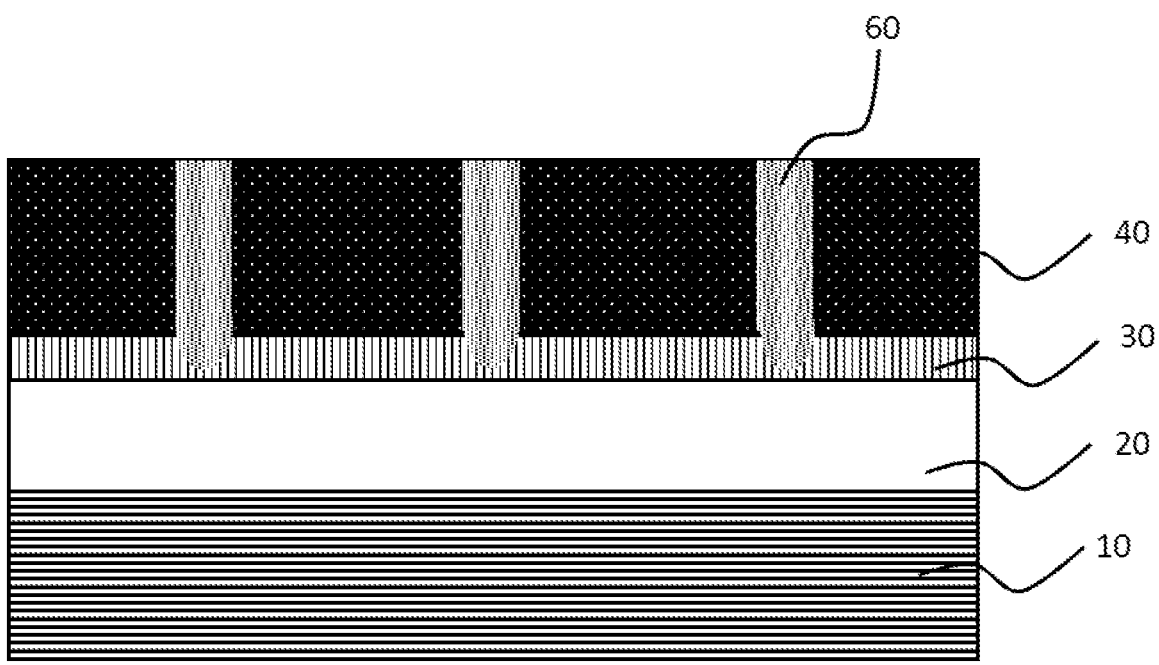
FIG. 3E is a schematic cross-sectional view showing a memory device at an immediate manufacture stage after CMP (chemical mechanic polishing) surface flattening.
Figure 3F:
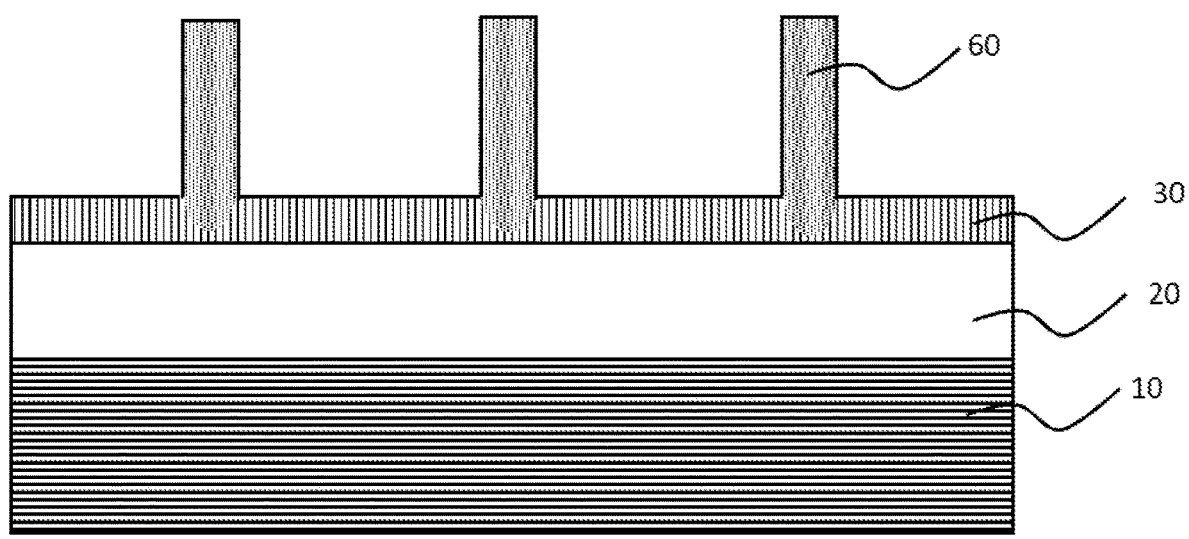
FIG. 3F is a schematic cross-sectional view showing a memory device at an immediate manufacture stage after removing the pattern-transfer molding layer.

The filled hard mask material 60 together with PTM 40 is lapped by chemical mechanic polishing (CMP) to remove the over-filled PTM material and to flatten the PTM surface. Then the PTM template 40 is removed by oxygen ashing (for Carbon based PTM material) or by RIE using CF4, and C, F, H containing as gases or SF6. To prevent Ta from being etched during PTM removal, the etching condition (such as process pressure, etching bias power and so on) should be tuned to favor SiO2, SiN or SiON removal. Ultra-small hard mask pillars 60 with right polarity with respect to the memory cell are thus formed. FIG. 3E is a schematic cross-sectional view showing a memory device at an immediate manufacture stage after CMP (chemical mechanic polishing) surface flattening, and FIG. 3F is a schematic cross-sectional view showing a memory device at an immediate manufacture stage after removing the pattern-transfer molding layer.

Figure 4:
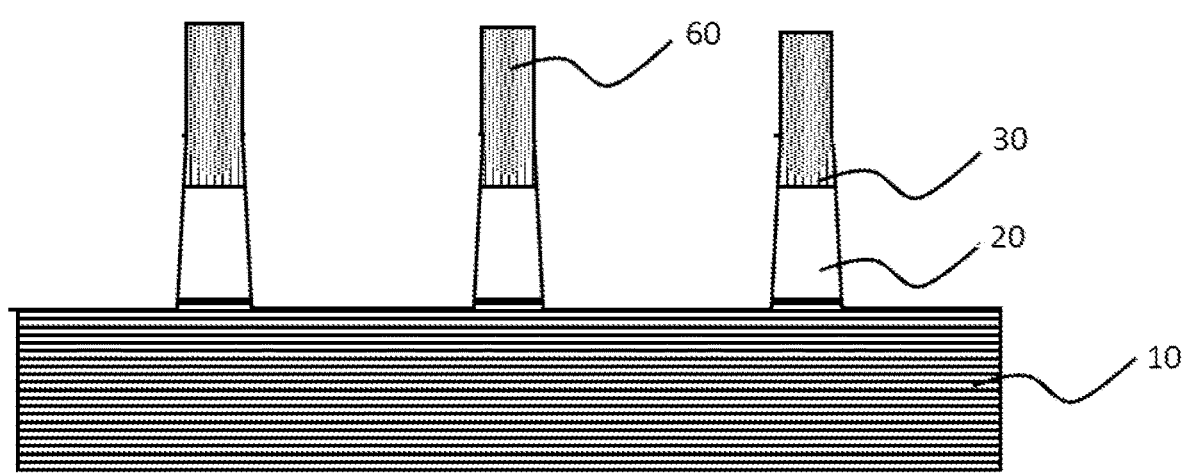
FIG. 4 is a schematic cross-sectional view showing a memory device at an immediate manufacture stage after etching of the memory film stack.

Using the well-formed hard mask pillars 60, the memory film stack element (MFSE) especially the MTJ stack is then etched by an reactive ion etch (RIE) using CH3OH, C2H5OH, or CO/NH3 as etching gases; or preferably adding some inert gas, such as Ar, Ne, He to improve etching profile. By monitoring and control the magnetic etching process, an in-situ end point detection scheme is used. The final MTJ memory pillars after etch is achieved. FIG. 4 is a schematic cross-sectional view showing a memory device at an immediate manufacture stage after etching of the memory film stack.

The invention claimed is:

1. A method for forming a memory device with an implanted hard mask with an ultra small dimension for fabricating an ultra small size memory array, the method comprising the sequential steps of:
   forming a memory film stack element (MFSE);
   forming a hard mask sustaining element (HMSE) atop the MFSE;
   forming a pattern transfer molding layer (PTM) atop the HMSE;
   forming a photoresist film element (PRE) atop the PTM;
   patterning the PRE with a reverse polarity;
   patterning the PTM using the patterned PRE as a mask to form a sidewall that defines a hard mask opening formed through the PTM exposing the HMSE;
   etching a top portion of the exposed HMSE using the patterned PTM as a mask while leaving a bottom portion of the exposed HMSE having a concave top surface in the hard mask opening, and defining an inner cavity in the hard mask opening;
   forming a hard mask material layer that completely fills the inner cavity;
   polishing a top surface of the hard mask material layer;
   removing the remaining PTM material, thus finalizing forming the implanted hard mask; and
   patterning the MFSE using the implanted hard mask as a mask.

2. The method of claim 1, wherein the MFSE comprises an element for making one of a magnetic random access memory (MRAM), a resistance random access memory (RRAM), a phase change random access memory (PCRAM), and a ferroelectric random access memory (FRAM).

3. The method of claim 1, wherein forming the MFSE comprises the steps of:
   forming a lower electrical contact (LEC);
   forming a memory stack (MS) atop the LEC; and
   forming a capping layer atop the MS.

4. The method of claim 3, wherein forming the MS comprises forming an MTJ tri-layer having:
   a magnetic reference layer atop the LEC;
   a tunneling layer atop the magnetic reference layer; and
   a magnetic memory layer atop the tunneling layer.

5. The method of claim 3, wherein forming the MS comprises forming an MTJ tri-layer having:
   a magnetic memory layer atop the LEC;
   a tunneling layer atop the magnetic memory layer; and
   a magnetic reference layer atop the tunneling layer.

6. The method of claim 1, wherein forming the HMSE comprises forming a sustaining layer having one or more material(s) selected from W, Ti, Ta, Zr, Hf, Nb, and Mo, and having a thickness ranging from around 2 nm to around 20 nm.

7. The method of claim 6, wherein forming the HMSE further comprises forming an etching stop layer before forming the sustaining layer and having one or more material(s) selected from Ru, Ni, Rh, Pd, Cu, Ag, Au, Pt, Fe, Co, NiCr, NiFeCr, and their alloys thereof, and having a thickness ranging from around 2 nm to around 10 nm.

8. The method of claim 1, wherein forming the PTM layer comprises forming a layer comprising one or more of amorphous carbon, SiO2, SiN and SiON, and having a thickness ranging from around 50 nm to around 200 nm, by one or more of the following methods:
   chemical vapor deposition (CVD);
   plasma enhanced chemical vapor deposition (PECVD);
   physical vapor deposition (PVD); and
   ion beam deposition (IBD).

9. The method of claim 1, wherein forming the PTM layer comprises forming a layer comprising one or more of SiO2, SiN, and SiON with a thickness ranging from around 50 nm to around 200 nm, by chemical vapor deposition (CVD) or plasma enhance chemical vapor deposition (PECVD).

10. The method of claim 1, wherein forming the photoresist element (PRE) comprises the steps of:

forming a forming a bottom antireflection coating layer or a Si-based antireflection coating layer; and forming a photoresist layer atop the bottom antireflection coating layer or the Si-based antireflection coating layer.

11. The method of claim 1, wherein forming the photoresist element (PRE) comprises the steps of:
forming an organic planarization layer (OPL);
forming an antireflection coating layer atop the OPL; and
forming a photoresist layer atop the antireflection coating layer.

12. The method of claim 1, wherein patterning the PTM comprises one of:
 a. applying reactive ion etching (RIE) using one or more gas(es) comprising one or more of CF4, C, F, and H if the PTM layer comprises one or more of SiO2, SiN, and SiON; and
 b. applying oxygen (O2, O3) ashing if the PTM layer comprises amorphous Carbon.

13. The method of claim 1, wherein etching the top of portion of the exposed HMSE comprises using one or more etching gas(es) comprising one or more of SF6, SF6+Ar, and Cl2.

14. The method of claim 1, wherein etching the top of portion of the exposed HMSE comprises using ion beam milling with ions of one or more of Ar+, Ne+, and Kr+.

15. The method of claim 1, wherein forming the hard mask material layer comprises the steps of:

a. forming a seed layer comprising one or more of W, Ta, Ti, WN, TaN, and TiN on surfaces of the inner cavity; and
 b. filling one or more of Ta, W, and other heavy transition metals by electroplating.

16. The method of claim 1, wherein forming the hard mask material layer comprises filling one or more of Ta, W, and other heavy transition metals into the inner cavity by one of:
 a. depositing the material using atomic layer deposition; and
 b. depositing the material using atomic layer deposition at an elevated temperature.

17. The method of claim 1, wherein polishing a top surface of the hard mask material layer comprises applying a chemical mechanical polishing on the top surface of the hard mask material layer until a top portion of the patterned PTM is exposed and the patterned PTM is polished down to a thickness range from around 50 nm to around 200 nm.

18. The method of claim 1, wherein removing the remained PTM material after the polishing step comprises a step of oxygen (O2, O3) ashing if the PTM comprises carbon.

19. The method of claim 1, wherein removing the remained PTM material after the polishing step comprises a step of reactive ion etching (RIE) using one or more gas(es) comprising one or more of CF4, C, F, S, and H if the PTM comprises one or more of SiO2, SiN, and SiON.

\* \* \* \* \*